(12) United States Patent
Kirn

(10) Patent No.: US 6,771,120 B2
(45) Date of Patent: Aug. 3, 2004

(54) REFERENCE GENERATION TECHNIQUE FOR MULTIPLE-REFERENCE AMPLIFIER

(75) Inventor: Larry Kirn, West Bloomfield, MI (US)

(73) Assignee: Jam Technologies, LLC, Boston, MA (US)

(*) Notice: Subject to any disclaimer, the term of this patent is extended or adjusted under 35 U.S.C. 154(b) by 0 days.

(21) Appl. No.: 09/929,310

(22) Filed: Aug. 14, 2001

(65) Prior Publication Data

US 2002/0033732 A1 Mar. 21, 2002

Related U.S. Application Data

(60) Provisional application No. 60/225,563, filed on Aug. 14, 2000.

(51) Int. Cl.[7] ............................................. H03F 3/38
(52) U.S. Cl. .................................. 330/10; 330/207 A
(58) Field of Search ............................. 330/10, 207 A, 330/297, 251; 327/291, 133, 292, 295

(56) References Cited

U.S. PATENT DOCUMENTS

| | | | |
|---|---|---|---|
| 4,016,501 A | * | 4/1977 | Jasinski et al. ............... 330/10 |
| 4,403,196 A | | 9/1983 | Grandmont .................. 330/10 |
| 4,471,314 A | | 9/1984 | Lindberg ..................... 330/10 |
| 4,773,096 A | | 9/1988 | Kirn ........................... 381/120 |
| 5,134,402 A | * | 7/1992 | Miyoshi ...................... 341/144 |
| 5,398,003 A | | 3/1995 | Heyl et al. .................... 330/10 |
| 5,610,553 A | | 3/1997 | Kirn ............................ 330/10 |
| 5,613,010 A | | 3/1997 | Heyl et al. .................... 381/117 |
| 5,886,572 A | | 3/1999 | Myers et al. ................. 330/10 |
| 5,909,153 A | | 6/1999 | Delano et al. ............... 332/107 |
| 5,949,282 A | | 9/1999 | Nguyen et al. ............... 330/10 |
| 5,982,231 A | * | 11/1999 | Nalbant ....................... 330/10 |
| 6,046,636 A | * | 4/2000 | Putzeys .................. 330/124 R |
| 6,115,726 A | * | 9/2000 | Ignjatovic ................... 708/300 |
| 6,150,880 A | | 11/2000 | Schweighofer ......... 330/207 A |
| 6,229,388 B1 | | 5/2001 | Nalbant ....................... 330/10 |

* cited by examiner

Primary Examiner—Timothy P. Callahan
Assistant Examiner—Cassandra Cox

(57) ABSTRACT

Circuitry generates a secondary reference voltage in a multi-reference amplifier as a function of a primary reference. As such, the secondary reference equals a known, fixed portion of the primary reference, thereby minimizing distortion due to variations in voltage (or current) ratio. A zero detector is used to monitor incoming data. When the input data is zero, the integral of primary or high-voltage reference represents pulse-width data of 'one.' This integral is compared with the integral presented to load through the buffer amplifier, such that the high-voltage reference integral commands a non-inverted output. The output of the amplifier across the load drives the digital integrator to produce higher or lower data values at its output, when enabled by the zero detector. The data value output of digital integrator is converted to a pulse-width train by pulse-width modulator, filtered, buffered, and switched to the load as the secondary reference voltage.

4 Claims, 2 Drawing Sheets

REFERENCE GENERATION TECHNIQUE FOR MULTIPLE-REFERENCE AMPLIFIER

REFERENCE TO RELATED APPLICATION

This application claims priority from U.S. provisional application Serial No. 60/225,563, filed Aug. 14, 2000, the entire contents of which are incorporated herein by reference.

FIELD OF THE INVENTION

This invention relates generally to electronic amplifiers and, in particular, to circuitry for reducing distortion in high-resolution switching amplifiers of the type wherein multiple references are switched to a load in accordance with an input signal.

BACKGROUND OF THE INVENTION

Multiple-reference switching amplifiers enhance resolution by switching two or more reference voltages to a load. Configurations of this type are described in patent application PCT/US99/26691, entitled 'Multi-Reference, High-Accuracy Switching Amplifier,' the contents of which are incorporated herein by reference.

In order to operate at low distortion, however, a known relationship must exist between the references used. That is, a known voltage or current (as appropriate) ratio must be present between each two references in order to correctly determine suitable duty cycles in conjunction with each reference. Although autonomous, fixed references may be used, considerable distortion can result due to even very small amounts of reference drift or instability.

Thus, there exists a need for a technique whereby correct reference ratios are presented to the load in applicable amplification schemes.

SUMMARY OF THE INVENTION

Broadly, this invention is directed to apparatus and methods for generating a secondary reference voltage for a multi-reference amplifier as a function of a primary reference. In so doing, the secondary reference equals a known, fixed portion of the primary reference, thereby minimizing distortion due to variations in voltage (or current) ratio.

In the preferred embodiment, the secondary or low-voltage reference is replaced with an amplifier connected across the load, a digital integrator, pulse-width modulator, filter and buffer amplifier. A zero detector is used to monitor incoming data. When the input data is zero, the integral of primary or high-voltage reference represents pulse-width data of 'one.' This integral is compared with the integral presented to load through the buffer amplifier, such that the high-voltage reference integral commands a non-inverted output. The output of the amplifier across the load drives the digital integrator to produce higher or lower data values at its output, when enabled by the zero detector. The data value output of digital integrator is converted to a pulse-width train by pulse-width modulator, filtered, buffered, and switched to the load as the secondary reference voltage.

DETAILED DESCRIPTION OF THE INVENTION

Figure 1:
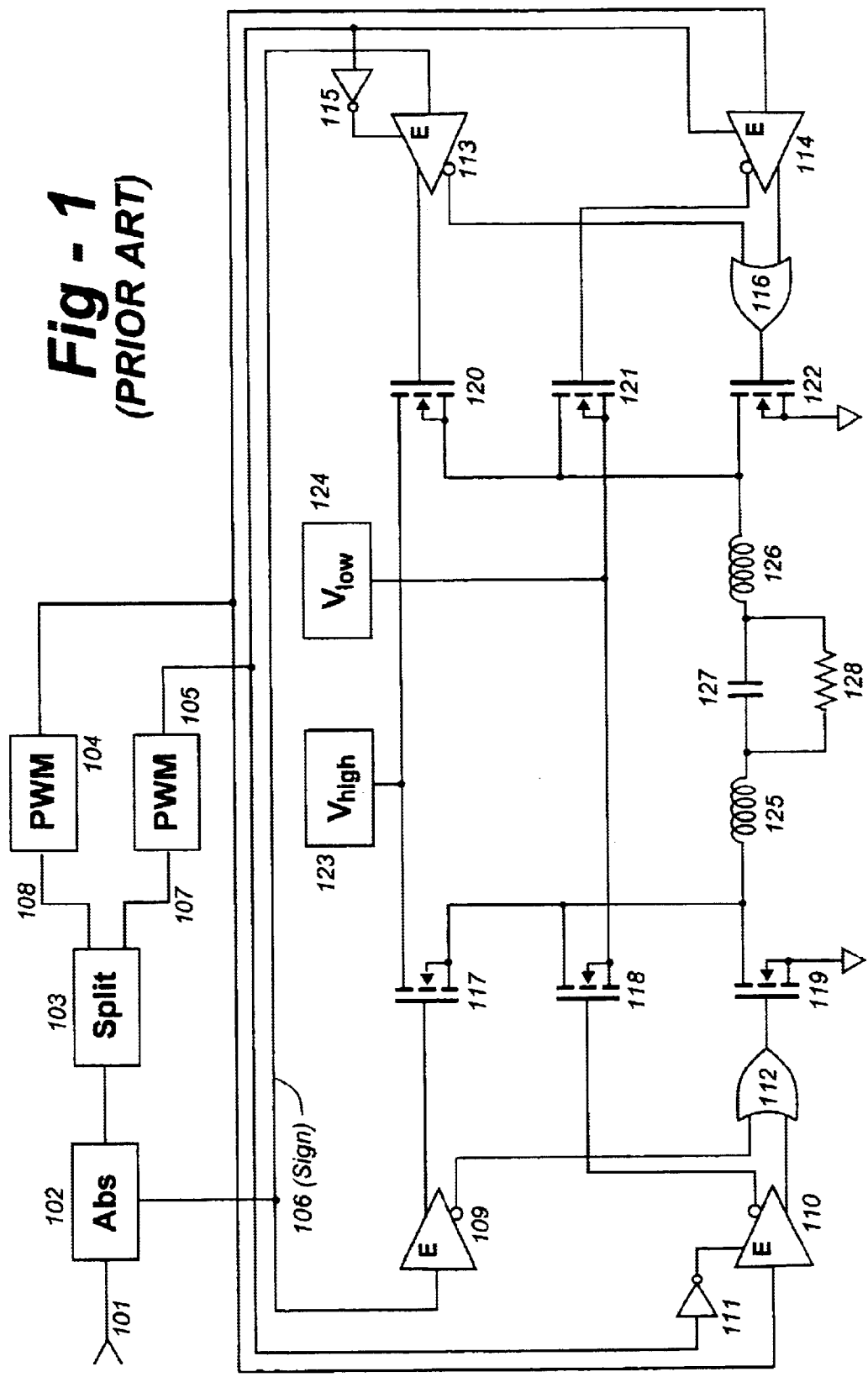
FIG. 1 is a block diagram of a prior-art dual-reference switching amplifier utilizing fixed references.

FIG. 1 is a block diagram of a prior-art dual-reference switching amplifier utilizing fixed references. The absolute value of incoming data 101 is provided to data splitter 103 through absolute value generator 102. Data splitter 103 separates the input into more significant data 108 (low resolution) and less significant data 107 (high resolution). More significant data 108 is applied to pulse-width modulator 104, which supplies a pulse-width train to data gates 109 and 113. Less significant data 107 is applied to pulse-width modulator 105, which supplies a pulse-width train to data gates 110 and 114.

Absolute value generator 102 also supplies the sign 106 of incoming data 101 to the enable inputs of data gates 109 and 114 directly, and the enable inputs of data gates 110 and 113 through inverters 111 and 115, respectively. Thus, data gates 110 and 115 are enabled when incoming data 101 is positive (sign=0), and data gates 109 and 114 are enabled when incoming data 101 is negative (sign=1).

Upon being enabled, data gates 109 and 113 activate switching devices 117 and 120 when their respective inputs are high, and switching devices 119 and 122, through OR gates 112 and 116, respectively, when their respective inputs are low. Upon being enabled, data gates 110 and 114 activate switching devices 119 and 122, through or gates 112 and 116, respectively, when their respective inputs are high, and switching devices 118 and 121 when their respective inputs are low.

Switching devices 117 and 120 connect high-voltage reference 123 to inductors 125 and 126, respectively, when activated. Switching devices 118 and 121 connect low-voltage reference 124 to inductors 125 and 126, respectively, when activated. Switching devices 119 and 122 connect ground to inductors 125 and 126, respectively, when activated.

The net effect of the foregoing is to supply a more significant pulse-width integral of high-reference voltage 123 to inductor 126, and a less significant pulse-width integral of low-reference voltage 124 to inductor 125, when the sign 106 of incoming data 101 is positive, and to supply a more significant pulse-width integral of high-reference voltage 123 to inductor 125 with a less-significant pulse-width integral of low-reference voltage 124 to inductor 126 when the sign 106 of incoming data 101 is negative.

Note that pulse-width modulator 105 yields a pulse width directly proportional to its input, whereas pulse-width modulator 104 yields a pulse width equivalent to the incoming data value plus one. The output of low-reference voltage 124 must then approach the value of the integral of high-reference voltage 123 at a pulse width of one. Resultantly, the quiescent voltages at both sides of load 128 are equal. Inductors 125 and 126, in conjunction with capacitor 127, filter undesired switching components from aforementioned integrals before application to the ultimate load 128.

Summarizing, it can thus be seen that high- and low-resolution integrals of the low- and high-voltage references, respectively, are applied to opposing terminals of load 128, under control of sign 106 of incoming data 101.

Figure 2:
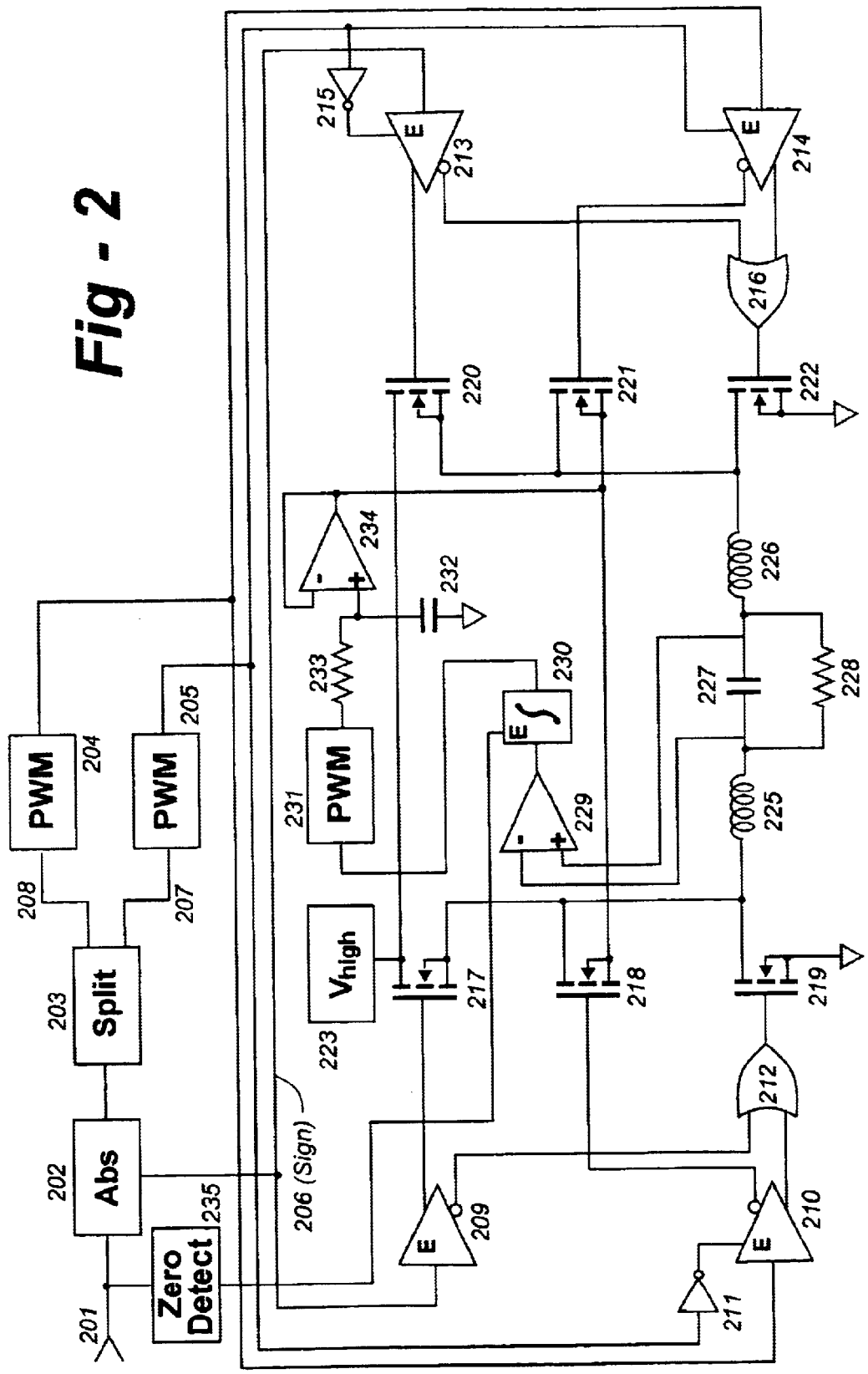
FIG. 2 is a diagram which depicts a preferred embodiment of the present invention.

Reference is now made to FIG. 2, which depicts a preferred embodiment of the present invention. Departure in terms of components and operation of FIG. 1 includes the replacement of low-voltage reference 124 with amplifier 229, integrator 230, pulse-width modulator 231, capacitor 232, resistor 233, and buffer amplifier 234.

When incoming data 201 is zero (null), it can be seen from the foregoing discussion that the integral of high-voltage reference 223 at pulse-width data of one (from pulse-width modulator 204) will be ultimately presented to load 228 through inductor 226. This integral is compared with the integral presented to load 228 through inductor 225 by amplifier 229, such that the high-voltage reference integral commands a non-inverted output. The output of amplifier 229 drives digital integrator 230 to produce higher or lower data values at its output, when its enable input is asserted by zero detector 235. Zero detector 235 monitors incoming data 201. The value output by digital integrator 230 is static when its enable input is not so asserted. The data value output of digital integrator 230 is converted to a pulse-width train by pulse-width modulator 231, filtered to a DC voltage by resistor 233 and capacitor 232, buffered by voltage follower 234, and presented to switching devices 218 and 221 as a reference voltage.

The result of this operation, functional solely when incoming data 201 is zero, is to produce a reference voltage at switching devices 218 and 221 which approaches the value of the integral of the high-voltage reference 223 at a pulse-width of one, thus nulling any voltage differential across load 228. Correct alignment of this voltage reference is thus assured, allowing monotonic output at any amplifier operating point. Although voltage references are disclosed, it will be apparent to one of skill in the art that equivalent operation using currents is possible through appropriate circuit modification.

I claim:

1. Apparatus for reducing distortion in a high-resolution switching amplifier of the type wherein multiple references are switched to a load in accordance with an input signal, comprising:

a source of a primary reference signal; and circuitry for calibrating a separate secondary reference signal as a function of the primary reference signal when the input signal is zero, such that the secondary reference signal approaches the value of the integral of the primary reference at a pulse-width of one.

2. The apparatus of claim 1, wherein the circuitry includes:

comparator connected across the load; and an integrator connected to receive the output of the comparator.

3. The apparatus of claim 2, wherein the circuitry further includes:

a pulse-width modulator connected to the output of the integrator.

4. A method of reducing distortion in a high-resolution switching amplifier of the type wherein primary and secondary references are switched to a load in accordance with an input signal, the method comprising the steps of:

comparing the integral of the primary reference to the integral of the voltage across the load when the input is zero; and pulse-width modulating the result of the comparison for use as the secondary reference.

* * * * *